United States Patent
Huang et al.

(10) Patent No.: US 8,420,208 B2
(45) Date of Patent: Apr. 16, 2013

(54) HIGH-K DIELECTRIC MATERIAL AND METHODS OF FORMING THE HIGH-K DIELECTRIC MATERIAL

(75) Inventors: Tsai-Yu Huang, Taipei County (TW); Ching-Kai Lin, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 139 days.

(21) Appl. No.: 12/854,734

(22) Filed: Aug. 11, 2010

(65) Prior Publication Data

US 2012/0040162 A1 Feb. 16, 2012

(51) Int. Cl.
*B32B 5/00* (2006.01)
*C01G 23/047* (2006.01)
*C23C 16/00* (2006.01)

(52) U.S. Cl.
USPC .... 428/220; 423/610; 438/761; 257/E21.266; 427/248.1; 427/255.36; 427/255.391

(58) Field of Classification Search .................. None
See application file for complete search history.

(56) References Cited

U.S. PATENT DOCUMENTS

| | | | |
|---|---|---|---|
| 6,573,547 B2 | 6/2003 | Ahn et al. | |
| 6,627,503 B2 | 9/2003 | Ma et al. | |
| 6,806,145 B2 | 10/2004 | Haukka et al. | |
| 6,953,721 B2 | 10/2005 | Agarwal | |
| 7,005,695 B1 | 2/2006 | Agarwal | |
| 7,238,628 B2 * | 7/2007 | Demaray et al. | 438/785 |
| 7,501,320 B2 | 3/2009 | Park et al. | |
| 7,700,988 B2 | 4/2010 | Lin et al. | |
| 2006/0237764 A1 | 10/2006 | Ahn et al. | |
| 2007/0048929 A1 * | 3/2007 | Park et al. | 438/238 |
| 2007/0051998 A1 | 3/2007 | Kil et al. | |
| 2007/0295973 A1 | 12/2007 | Jinbo et al. | |
| 2008/0118731 A1 | 5/2008 | Srinivasan et al. | |
| 2009/0134445 A1 | 5/2009 | Park et al. | |

OTHER PUBLICATIONS

H. Toku et al., "Influence of Process Parameters on the Growth of Pure-Phase Anatase and Rutile TiO2 Thin Films Deposited by Low Temperature Reactive Magnetron Sputtering," Brazilian Journal of Physics, vol. 40, No. 3, Sep. 30, 2010.*

Rutile Lattice Crystal Structure, http://cst-www.nrl.navy.mil/lattice/struk/c4.html, updated Oct. 2004.*

Ha Yong Lee et al., "Correlation between Surface Morphology and Hydrophilic/Hydrophobic Conversion of MOCVD-TiO2 Films," Langmuir 2000, 16, 7289-7293.*

Aarik et al., "Morphology and structure of TiO2 thin films grown by atomic layer deposition," Journal of Crystal Growth 148 (1995) 268-275.*

(Continued)

*Primary Examiner* — David Sample
*Assistant Examiner* — Nicole T Gugliotta
(74) *Attorney, Agent, or Firm* — TraskBritt

(57) ABSTRACT

A method of forming a high-k dielectric material including forming at least two portions of titanium dioxide, the at least two portions of titanium dioxide comprising a first portion comprising amorphous titanium dioxide and a second portion comprising rutile titanium dioxide. A method of forming a high-k dielectric material including forming a first portion of titanium dioxide at a temperature of from about 150° C. to about 350° C. and forming a second portion of titanium dioxide at a temperature of from about 350° C. to about 600° C. A high-k dielectric material is also disclosed.

19 Claims, 5 Drawing Sheets

OTHER PUBLICATIONS

M.H. Cho et al., "Growth of high quality rutile TiO2 thin film using ZnO buffer layer on Si(100) subtrate," Thin Solid Films 516 (2008) 5877-5880.*

International Search Report, International Application No. PCT/US2011/046109, mailed Mar. 9, 2012, three (3) pages.

Written Opinion of the International Searching Authority, International Application No. PCT/US2011/046109, mailed Mar. 9, 2012, five (5) pages.

Aarik, J., et al., "Morphology and structure of TiO2 thin films grown by atomic layer deposition," Journal of Crystal Growth, Mar. 1, 1995, vol. 148, Issue 3, pp. 268-275.

Ferguson, J.D., et al., "TiO2 atomic layer deposition on ZrO2 particles using alternating exposures of TiCl4 and H2O," Applied Surface Science, Mar. 30, 2004, vol. 226, Issue 4, pp. 393-404.

Szczyrbowski, J., et al., "Some properties of TiO2-layers prepared by mid-frequency and dc reactive magnetron sputtering," Journal of Non-Crystalline Solids, Sep. 2, 1997, vol. 218, pp. 262-266.

* cited by examiner

US 8,420,208 B2

HIGH-K DIELECTRIC MATERIAL AND METHODS OF FORMING THE HIGH-K DIELECTRIC MATERIAL

TECHNICAL FIELD

Embodiments of the present invention relate to a dielectric material having a high dielectric constant (k) and a smooth surface. More specifically, the present invention, in various embodiments, relates to a method of forming the high-k dielectric material including at least two portions, one portion being amorphous titanium dioxide ($TiO_2$) and the other portion being a rutile $TiO_2$, and the dielectric material produced therefrom.

BACKGROUND

A memory cell, such as a dynamic random access memory (DRAM) cell, typically includes a charge storage capacitor coupled to an access device, such as a Metal-Oxide-Semiconductor Field Effect Transistor (MOSFET). The MOSFET functions to apply or remove charge on the capacitor, thus affecting a logical state defined by the stored charge. The conditions of DRAM operation, such as operating voltage, leakage rate and refresh rate, will, in general, mandate that a certain minimum charge be stored by the capacitor.

Capacitors include two conductors, such as parallel metal or polysilicon plates, which act as electrodes. The electrodes are insulated from each other by a dielectric material. One type of capacitor used in DRAM cells is a metal-insulator-metal (MIM) capacitor. The dielectric constant, k, of the dielectric material (i.e., insulator material) in the capacitor is a crucial element for mass-producing DRAM cells. For example, a 3×nm DRAM cell or larger requires a dielectric material having a dielectric constant of at least about 55 in order to achieve the desired capacitance in capacitor.

Crystalline dielectric materials tend to have a higher dielectric constant than amorphous dielectric materials. For example, rutile $TiO_2$ has a dielectric constant of about 170 along the c-axis of the crystal structure and about 90 along the a-axis of the crystal structure, while amorphous $TiO_2$ has a dielectric constant of about 30. However, because of the crystal formation of the rutile $TiO_2$, the rutile $TiO_2$ has a very rough surface, which results in an increased current leakage. In conventional semiconductor structures, $TiO_2$ grown by atomic layer deposition (ALD) has an amorphous structure and a dielectric constant of about 30.

DETAILED DESCRIPTION

Figure 1:
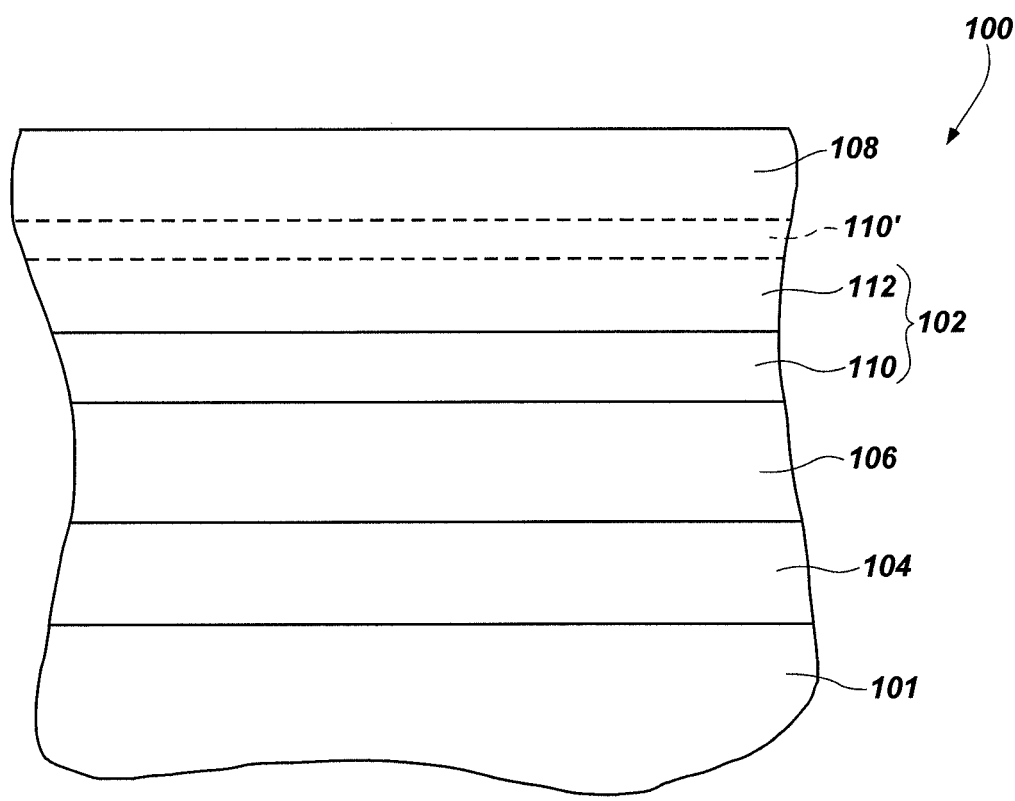
FIG. 1 is a cross-sectional view of a portion of a memory cell including a high-k dielectric material formed in accordance with an embodiment of the invention.

A high-k dielectric material having a low current leakage and methods of forming such a high-k dielectric material are disclosed. As used herein, the phrase "high-k" means and includes a dielectric material having a dielectric constant, k, of at least about 55. The high-k dielectric material is formed by forming a first portion of amorphous titanium dioxide ($TiO_2$) and forming another portion including rutile $TiO_2$. By forming a first portion of amorphous $TiO_2$ and a second portion of rutile $TiO_2$, the high-k dielectric material may exhibit a high k value due to the rutile $TiO_2$ but a smoother surface due to the amorphous $TiO_2$, reducing current leakage. Accordingly, a dielectric material having the desired high-k value and low current leakage is achieved.

The following description provides specific details, such as material types, material thicknesses, and processing conditions in order to provide a thorough description of embodiments of the present invention. However, a person of ordinary skill in the art will understand that the embodiments of the present invention may be practiced without employing these specific details. Indeed, the embodiments of the present invention may be practiced in conjunction with conventional fabrication techniques employed in the industry. In addition, the description provided herein does not form a complete process flow for manufacturing a DRAM device, and the DRAM device described below does not form a complete semiconductor device. Only those process acts and structures necessary to understand the embodiments of the present invention are described in detail below. Additional acts to form a complete semiconductor device including the DRAM device may be performed by conventional techniques.

The materials described herein may be formed by any suitable technique including, but not limited to, spin coating, blanket coating, chemical vapor deposition (CVD), ALD, plasma enhanced ALD, or physical vapor deposition (PVD). Alternatively, the materials may be grown in situ. Depending on the specific material to be formed, the technique for depositing or growing the material may be selected by a person of ordinary skill in the art. While the materials described and illustrated herein may be formed as layers, the materials are not limited thereto and may be formed in other three-dimensional configurations.

In the following detailed description, reference is made to the accompanying drawings, which form a part hereof, and in which is shown, by way of illustration, specific embodiments in which the invention may be practiced. These embodiments are described in sufficient detail to enable a person of ordinary skill in the art to practice the invention. However, other embodiments may be utilized, and structural, logical, and electrical changes may be made without departing from the scope of the invention. The illustrations presented herein are not meant to be actual views of any particular high-k dielectric material, DRAM device, or system, but are merely idealized representations which are employed to describe embodiments of the present invention. The drawings presented herein are not necessarily drawn to scale. Additionally, elements common between drawings may retain the same numerical designation.

The high-k dielectric material may be formed from $TiO_2$. In one embodiment, the first portion of the high-k dielectric material when formed is amorphous $TiO_2$ and the second portion of the high-k dielectric material is rutile $TiO_2$.

FIG. 1 is an illustration of a semiconductor structure 100 including a high-k dielectric material 102. The semiconductor structure 100 may include a substrate 101 upon which the high-k dielectric material 102 is formed. The high-k dielectric material 102 may include at least two portions 110, 112 thereof. The substrate 101 may include a conventional silicon substrate or other bulk substrate including a layer of semiconductor material. As used herein, the term "bulk substrate" includes not only silicon wafers, but also silicon-on-insulator (SOI) substrates, silicon-on-sapphire (SOS) substrates, epitaxial layers of silicon on a base semiconductor foundation, and other semiconductor or optoelectronics materials, such as silicon-germanium, germanium, gallium arsenide, or indium phosphide. The material of the substrate 101 may be doped or undoped. An insulator material 104 may be formed over the surface of the substrate 101. The insulator material 104 may be formed from a silicon oxide ($SiO_x$) material suitable as an insulative or dielectric material or from silicon nitride ($Si_3N_4$), such as, for example, SiO, $SiO_2$, or $Si_3N_4$. The insulator material 104 may be formed by conventional techniques, such as by plasma enhanced CVD (PECVD) or standard thermal CVD. A first electrode 106 may be formed over the insulator material 104. The first electrode 106 may be formed of any suitable conductive material including, but not limited to, metals, metal alloys, conductive metal oxides, and mixtures thereof. For example, the first electrode 106 may be formed of tungsten (W), nickel (Ni), tantalum nitride (TaN), platinum (Pt), tungsten nitride (WN), gold (Au), titanium nitride (TiN), titanium aluminum nitride (TiAlN), ruthenium (Ru), or ruthenium oxide ($RuO_2$). The first electrode 106 may have a thickness of from about 50 Angstroms to about 1000 Angstroms.

The high-k dielectric material 102 may be formed on the first electrode 106. The high-k dielectric material 102 may have a sufficiently high k value and low current leakage to form the semiconductor structure 100, which may be a capacitor. To provide a sufficiently high k value and low current leakage of dielectric material 102, the high-k dielectric material 102 includes a first portion 110 of amorphous $TiO_2$ and a second portion 112 of rutile $TiO_2$. Rutile $TiO_2$ has a higher dielectric constant than amorphous $TiO_2$. For example, rutile $TiO_2$ has a dielectric constant of about 170 along the c-axis of the crystal structure and a dielectric constant of about 90 along the a-axis of the crystal structure. Amorphous $TiO_2$ has a dielectric constant of about 30. While rutile $TiO_2$ has a higher dielectric constant than amorphous $TiO_2$, rutile $TiO_2$ exhibits a higher surface roughness than the amorphous $TiO_2$. The higher surface roughness of the rutile $TiO_2$ results in a semiconductor structure having a higher current leakage than the semiconductor structure 100 including the amorphous $TiO_2$ and the rutile $TiO_2$. By forming the high-k dielectric material 102 to include the first portion 110 of amorphous $TiO_2$ and the second portion 112 of rutile $TiO_2$, the high-k dielectric material 102 has a higher dielectric constant than a dielectric material formed only of amorphous $TiO_2$ and a lower surface roughness than a dielectric material formed only of rutile $TiO_2$. In some embodiments, the amorphous $TiO_2$ may transition to the rutile phase during formation of the rutile $TiO_2$ 112 resulting in the high-k dielectric material 102 comprising two portions 110, 112 of rutile $TiO_2$. However, the high-k dielectric material 102 may still exhibit a lower surface roughness than a dielectric material formed only of rutile $TiO_2$.

The two portions 110, 112 of the high-k dielectric material 102 may be formed over the first electrode 106. The first portion 110 of the high-k dielectric material 102, which is in contact with the first electrode 106, may be formed of amorphous $TiO_2$ and is also referred to herein as amorphous $TiO_2$ 110. As used herein, the phrase "amorphous $TiO_2$" refers to $TiO_2$ having an at least about 70% amorphous crystal structure. The amorphous $TiO_2$ 110 may be formed in direct contact with the upper surface of first electrode 106. The second portion 112 of the high-k dielectric material 102 may be formed of rutile $TiO_2$ or crystalline $TiO_2$, and is also referred to herein as rutile $TiO_2$ 112. As used herein, the phrase "rutile $TiO_2$" refers to $TiO_2$ having an at least about 70% rutile crystal structure. The rutile $TiO_2$ 112 may be formed over and in contact with the amorphous $TiO_2$ 110. The amorphous $TiO_2$ 110 and rutile $TiO_2$ 112 are collectively referred to herein as the high-k dielectric material 102.

The thickness of the high-k dielectric material 102 may depend on the size and shape of the semiconductor structure 100 to be ultimately formed. In one embodiment, for example, the high-k dielectric material 102 may have a thickness of from about two nanometers (2 nm) to about fifteen nanometers (15 nm). The amorphous $TiO_2$ 110 may have a thickness of from about two tenths of a nanometer (0.2 nm) to about five nanometers (5 nm). The rutile $TiO_2$ 112 may have a thickness of from about one nanometer (1 nm) to about ten nanometers (10 nm).

The high-k dielectric material 102 may have a dielectric constant of at least about 55. In some embodiments, the high-k dielectric material 102 may have a dielectric constant of at least about 75. Increasing the thickness of the rutile $TiO_2$ 112, relative to the amorphous $TiO_2$ 110, may increase the dielectric constant of the high-k dielectric material 102. In other words, the thicker the rutile $TiO_2$ 112, the higher the dielectric constant may be of the high-k dielectric material 102.

Figures 2, 3:
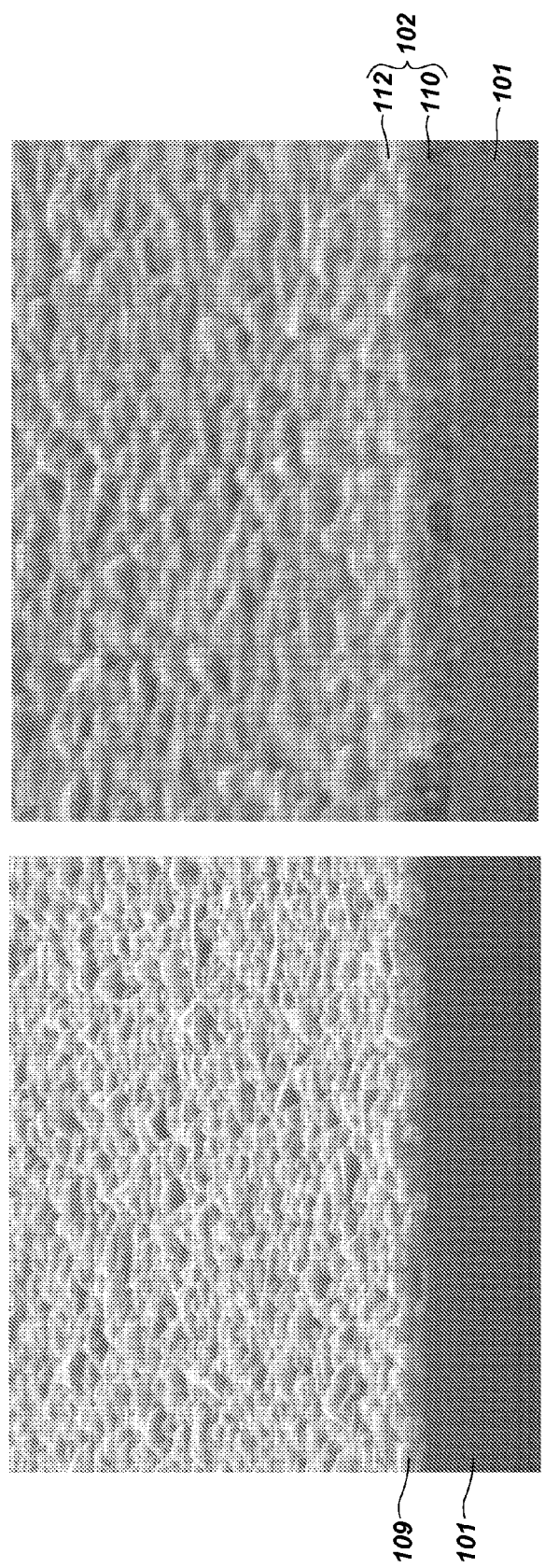
FIG. 2 is an electron microscopy image of a surface of rutile $TiO_2$.
FIG. 3 is an electron microscopy image of a surface of $TiO_2$ having a first portion of amorphous $TiO_2$ and a second portion of rutile $TiO_2$.

The high-k dielectric material 102 may have a relatively smooth surface compared to a dielectric material formed of only rutile $TiO_2$. For example, FIGS. 2 and 3 are electron microscopy photographs showing a rutile phase only $TiO_2$ (FIG. 2) compared to the high-k dielectric material 102 (FIG. 3) of the present invention. As can be seen by the comparison of FIG. 2 and FIG. 3, because the $TiO_2$ in FIG. 3 was formed with the first portion 110 of amorphous $TiO_2$, the surface of the second portion 112 of rutile $TiO_2$ is substantially smoother than a surface 109 of the rutile phase only $TiO_2$ shown in FIG. 2. The resulting high-k dielectric material 102 may be substantially crystalline with a rutile component.

A portion of the semiconductor structure 100, optionally, may include an amorphous $TiO_2$ 110' formed over the rutile $TiO_2$ 112, as illustrated in FIG. 1 with dashed lines. The amorphous $TiO_2$ 110' may further decrease the surface roughness of the high-k dielectric material 102 and, therefore, may further decrease the current leakage of the high-k dielectric material 102. Alternatively, in additional embodiments, an amorphous oxide material (not shown) other than amorphous $TiO_2$ may be formed over the rutile $TiO_2$. For example, amorphous aluminum oxide ($Al_2O_3$), amorphous silicon dioxide ($SiO_2$), amorphous zirconium dioxide ($ZrO_2$), or amorphous hafnium dioxide ($HfO_2$) (not shown) may be formed over the rutile $TiO_2$ 112.

The high-k dielectric material 102 may have a substantially homogeneous composition throughout its thickness in that the amorphous $TiO_2$ 110 and rutile $TiO_2$ 112 are both $TiO_2$. In additional embodiments, as previously described, the amorphous $TiO_2$ 110 may transition to a rutile $TiO_2$ during formation of the rutile $TiO_2$ 112. In such instances, the portions of the high-k dielectric material 102 may not be distinguishable by visual or chemical means, such as by microscopy or chemical analysis.

A second electrode 108 may be formed over the high-k dielectric material 102. The second electrode 108 may be formed of the same or a different material than the first electrode 106. The second electrode 108 may be formed of any suitable conductive material including, but not limited to, metals, metal alloys, conductive metal oxides, and mixtures thereof. For example, the first electrode 106 may be formed of tungsten (W), nickel (Ni), tantalum nitride (TaN), platinum (Pt), tungsten nitride (WN), gold (Au), titanium nitride (TiN), titanium aluminum nitride (TiAlN), ruthenium (Ru), or ruthenium oxide ($RuO_2$). The second electrode 108 may have a thickness of about 50 Angstroms to about 1000 Angstroms. The first electrode 106, high-k dielectric material 102, and second electrode 108 may form a MIM capacitor 113 as described in greater detail below.

Figure 4:
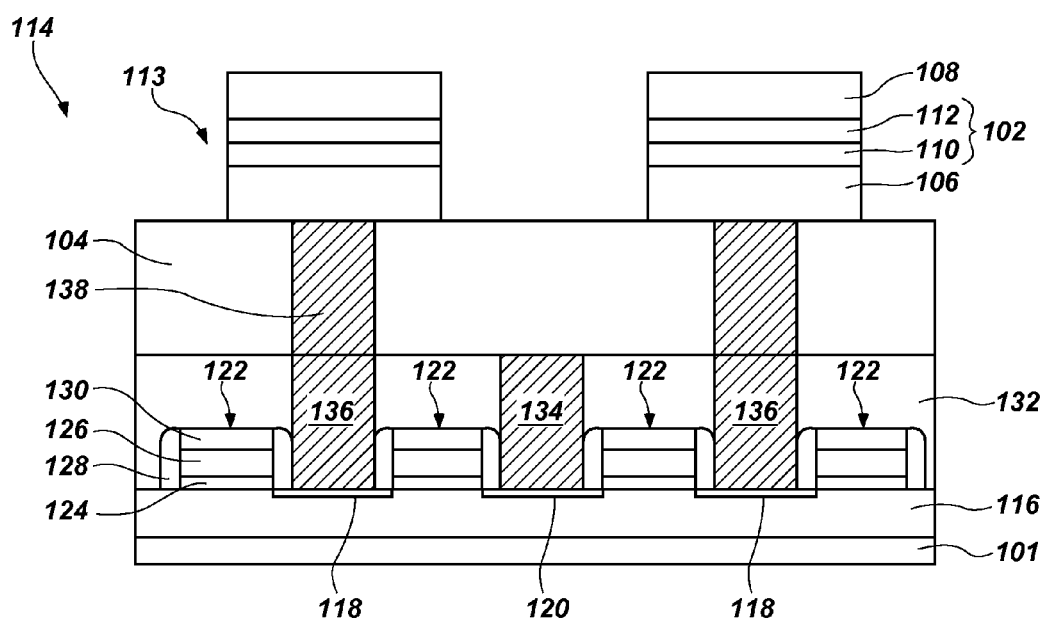
FIG. 4 is a cross-sectional view of a DRAM device in accordance with an embodiment of the invention.

The high-k dielectric material 102 may be used in a DRAM device 114, as illustrated in FIG. 4. While the high-k dielectric material 102 is illustrated as being present in the DRAM device 114, the high-k dielectric material 102 may also be used in other devices, such as a complementary metal-oxide semiconductor (CMOS) device. Furthermore, while the high-k dielectric material 102 is described herein as part of a capacitor 113, it is understood that the high-k dielectric material 102 may be used for other portions of a semiconductor structure as well. The DRAM device 114 includes a memory matrix or array (not shown) that includes a plurality of capacitors 113. The memory matrix is coupled to periphery circuitry (not shown) by a plurality of control lines. The periphery circuitry may include circuitry for addressing the plurality of capacitors 113 contained within the memory matrix, along with circuitry for storing data in and retrieving data from the memory cells. The periphery circuitry may also include other circuitry used for controlling or otherwise ensuring the proper functioning of the DRAM device 114.

As shown in FIG. 4, the DRAM device 114 includes a plurality of memory cells formed on the substrate 101. The memory cells include a well 116, drain regions 118, source regions 120, and wordlines or gate stacks 122 formed on the substrate 101 according to conventional semiconductor processing techniques, which are not described in detail herein. The gate stacks 122 may include a gate oxide region 124, a conductive gate region 126, spacers 128, and a cap 130. A first insulating material 132 may be formed over the gate stacks 122 having bit contacts 134 and first capacitor contacts 136 formed therein. The bit contacts 134 may be in electrical communication with the source regions 120 and the first capacitor contacts 136 may be in electrical communication with the drain regions 118. The insulating material 104 may be formed over the first insulating material 132 and the bit contacts 134 and second capacitor contacts 138 may be formed in the insulating material 104. The capacitors 113 are formed in electrical communication with the second capacitor contacts 138. The capacitors 113 include the first electrode 106, the high-k dielectric material 102 including the first portion 110 of the amorphous $TiO_2$ and the second portion 112 of the rutile $TiO_2$, and the second electrode 108.

The capacitor 113 may be a metal-insulator-metal (MIM) capacitor with the high-k dielectric material 102 acting as the insulator portion of the MIM capacitor 113. The DRAM device 114 may be formed by conventional techniques and materials which, are not described in detail herein. The DRAM device 114 may, optionally, include the amorphous $TiO_2$ 110' (not illustrated in FIG. 4) formed between the rutile $TiO_2$ 112 and the second electrode 108. Alternatively, in additional embodiments, another amorphous oxide material such as amorphous $Al_2O_3$, $SiO_2$, $ZrO_2$, or $HfO_2$ may be formed between the rutile $TiO_2$ 112 and the second electrode 108. The amorphous $TiO_2$ 110' (FIG. 1) or other amorphous oxide material may further decrease current leakage between the high-k dielectric material 102 and the second electrode 108.

Figure 5:
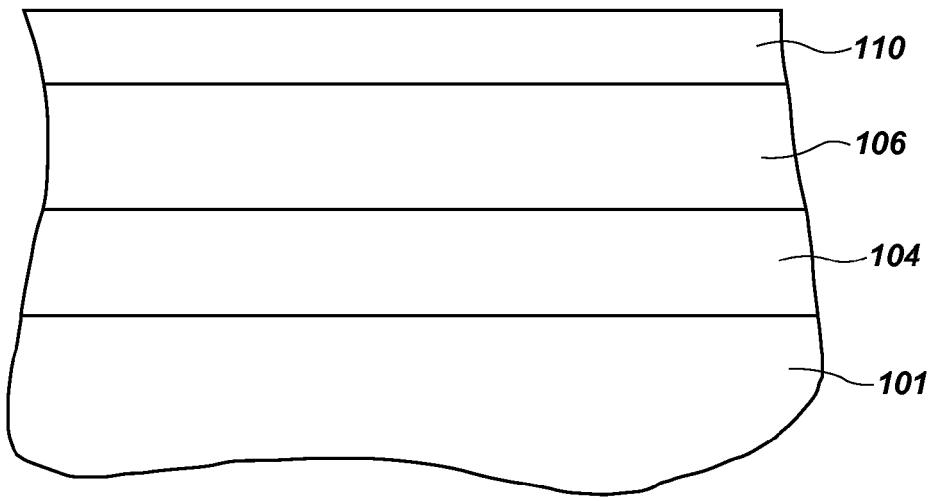
FIGS. 5 and 6 are illustrations of a method of forming the portion of the memory cell including the high-k dielectric material of FIG. 1.
Figure 6:
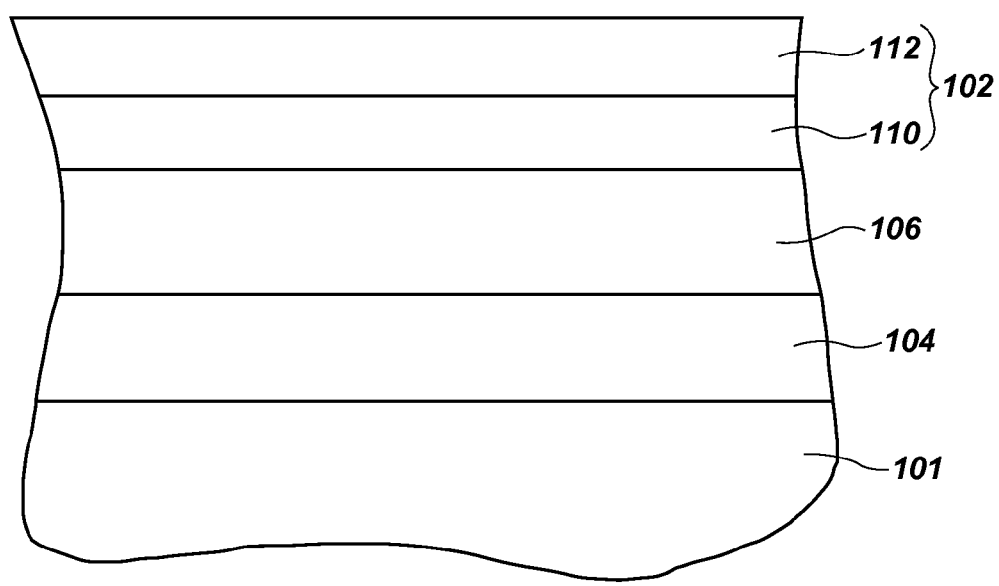

FIGS. 5 and 6 illustrate one embodiment of a method of forming the high-k dielectric material 102. As shown in FIG. 5, the first portion 110 of the high-k dielectric material 102 (FIG. 6) may be formed over the first electrode 106, which may be formed over the insulating material 104 on the substrate 101. The first portion 110 of the high-k dielectric material 102 and the second portion 112 (FIG. 6) of the high-k dielectric material 102 may be formed by atomic layer deposition (ALD). As used herein, the term "atomic layer deposition" refers to a deposition process in which a plurality of consecutive deposition cycles is conducted in a deposition chamber. The ALD also includes an atomic layer epitaxy (ALE). In ALD, a first chemical precursor is chemisorbed to a surface of a substrate, forming approximately a monolayer of the first chemical. Excess first chemical precursor is purged from a deposition chamber. A second chemical precursor and, optionally, a reaction gas, are introduced into the deposition chamber. Approximately, a monolayer of the second chemical is formed, which reacts with the monolayer of the first chemical. Excess reaction gas, excess second chemical precursor, and by-products are removed from the deposition chamber. By repeating the ALD pulses, monolayers of the first chemical and second chemical are formed until a desired thickness of the material is achieved. By way of example, the first chemical precursor may be titanium tetrachloride ($TiCl_4$) and the second chemical precursor may be water ($H_2O$). The $TiCl_4$ may be introduced into the deposition chamber and chemisorbed to the surface of the first electrode 106 to form a monolayer of titanium. The $H_2O$ may be introduced into the deposition chamber and chemisorbed to the surface of the monolayer of titanium to form a monolayer of oxide. The monolayer of titanium and the monolayer of oxide may be reacted to form $TiO_2$.

The first portion 110 of the high-k dielectric material 102 may be formed as amorphous $TiO_2$ by controlling the temperature of the ALD process such that the desired crystal structure of $TiO_2$ is formed. The amorphous $TiO_2$ 110 is formed by depositing the monolayers of the titanium and oxide at a low temperature. For example, the first portion 110 may be formed at a temperature of from about 150° C. to about 350° C. In one embodiment, the first portion 110 is deposited at 285° C., resulting in the $TiO_2$ having a smooth surface. The first portion 110, as formed, may be substantially amorphous.

As shown in FIG. 6, the second portion 112 of the high-k dielectric material 102 may be formed over the first portion 110 of the high-k dielectric material 102. The second portion 112 may be formed as rutile $TiO_2$ by controlling the temperature of the ALD process such that the desired crystal structure is formed. The section portion 112, as formed, may be substantially crystalline. The rutile $TiO_2$ 112 may be formed by depositing monolayers of the titanium and oxide at a higher temperature than that used to form the first portion 110 of the high-k dielectric material 102. For example, the second portion 112 may be formed at a temperature of from about 350° C. to about 600° C. In one embodiment, the second portion 112 is deposited at 500° C. Like the first portion 110, the second portion 112 may be formed of $TiO_2$ and the first and second chemical precursors for forming the second portion 112 may include $TiCl_4$ and $H_2O$. Forming the second portion 112 at 500° C. and using $TiCl_4$ and $H_2O$ as the first and second chemical precursors may stabilize the growth of the $TiO_2$. During the deposition of the second portion 112, the first portion 110 may transition from amorphous $TiO_2$ to rutile $TiO_2$ because of the high temperatures of the deposition of the second portion 112. Referring to FIG. 1, the second electrode 108 may be formed over the second portion 112 of the high-k dielectric material 102.

Figure 7:
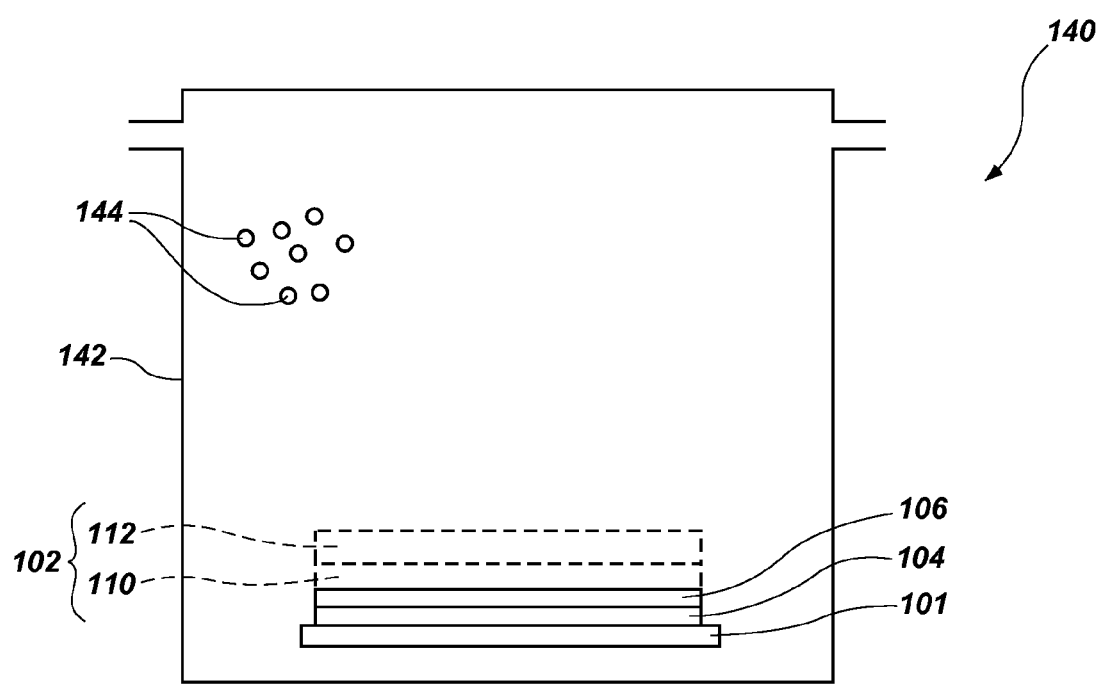
FIG. 7 is a deposition system in accordance with an embodiment of the invention.

A system 140 for forming the high-k dielectric material 102 on the substrate 101 is illustrated in FIG. 7. The substrate 101 including the insulator material 104 and the first electrode 106 may be positioned or placed on a support or chuck (not shown) of a deposition chamber 142 into which the first and second chemical precursors 144 are capable of being introduced. By adjusting the temperature in the deposition chamber 142, the amorphous $TiO_2$ 110 and the rutile $TiO_2$ 112 may be formed, as shown in dashed lines in FIG. 7. By way of non-limiting example, the deposition chamber 142 may be a conventional ALD chamber or ALD tool. In one embodiment, the deposition chamber is an Entron system, such as an ENTRON™ EX300 RF sputtering chamber, which is commercially available from Ulvac Technologies, Inc. (Methuen, Mass.).

After positioning the substrate 101 having the insulator material 104 and the first electrode 106 on the chuck, the amorphous $TiO_2$ 110 may be formed on the first electrode 106. The first and second chemical precursors 144 may be sequentially introduced into the deposition chamber 142 and the temperature of the deposition chamber 142 may be adjusted to the appropriate conditions for forming the amorphous $TiO_2$ 110. For example, the temperature of the deposition chamber 142 may be adjusted to from about 150° C. to about 350° C. The first chemical precursor may be introduced into the deposition chamber 142 to form a first monolayer of the first chemical on the first electrode 106. The deposition chamber 142 may then be purged and the second chemical precursor may be introduced into the deposition chamber 142 to form a monolayer of the second chemical over the monolayer of the first chemical. The monolayer of the first chemical and the monolayer of the second chemical may then be reacted to form a first layer of the amorphous $TiO_2$ 110. A desired thickness of the amorphous $TiO_2$ 110 may be achieved, as known in the art, by controlling the deposition time, number of ALD cycles conducted, etc. After the amorphous $TiO_2$ 110 is produced, the temperature of the deposition chamber 142 may be increased to form the rutile $TiO_2$ 112. For example, the temperature of the deposition chamber 142 may be increased to from about 350° C. to about 600° C. The first and second chemical precursors 144 may then sequentially be introduced into the deposition chamber 142 as previously discussed until the desired thickness of the rutile $TiO_2$ 112 is achieved. Because of the temperature of the deposition of the rutile $TiO_2$, the high-k dielectric material 102 does not require annealing after deposition of the second portion 112.

The two portions of the high-k dielectric material 102 may be formed in a single deposition chamber 142 by adjusting the temperature during the ALD process. By forming both the amorphous $TiO_2$ 110 and the rutile $TiO_2$ 112 in situ, the high-k dielectric material 102 may be produced using a single deposition act. As such, the high-k dielectric material 102 may be produced in a cost-effective manner. In addition, the throughput for forming the high-k dielectric material 102 on the first electrode 106 may be increased because the substrate 101 upon which the two portions of the high-k dielectric material 102 are formed does not need to be transferred between tools.

CONCLUSION

In some embodiments, the present invention includes materials having a high dielectric constant, and methods of forming such materials. The material may include rutile phase titanium dioxide having an at least substantially smoother surface than a rutile phase titanium dioxide deposited at a temperature greater than about 500° C.

In additional embodiments, the present invention includes methods of forming a material having a high dielectric constant. The methods include forming at least two portions of titanium dioxide, the titanium dioxide comprising a first portion comprising amorphous titanium dioxide and a second portion comprising rutile titanium dioxide. The at least two portions of titanium dioxide may be formed by atomic layer deposition.

In further embodiments, the present invention includes methods of forming a high dielectric constant material. The methods include forming a first portion of titanium dioxide at a temperature of from about 150° C. to about 350° C. and forming a second portion of titanium dioxide at a temperature of from about 350° C. to about 600° C.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention encompasses all modifications, variations and alternatives falling within the scope of the invention as defined by the following appended claims and their legal equivalents.

What is claimed is:

1. A material having a high dielectric constant, comprising at least two portions of titanium dioxide, the at least two portions of titanium dioxide comprising at least a first portion of amorphous titanium dioxide and at least a second portion of crystalline titanium dioxide, wherein the material has a thickness of from about 1.2 nanometers to about 15 nanometers.

2. The material of claim 1, wherein the at least a second portion of crystalline titanium dioxide comprises rutile phase titanium dioxide.

3. The material of claim 1, wherein the material has a lower current leakage than a rutile phase titanium dioxide.

4. The material of claim 1, wherein the at least a first portion of amorphous titanium dioxide has a thickness of from about 0.2 nanometer to about 5 nanometers and the at least a second portion of crystalline titanium dioxide has a thickness of from about 1 nanometer to about 10 nanometers.

5. A method of forming a material having a high dielectric constant, comprising:
   forming at least two portions of titanium dioxide having a combined thickness of from about 1.2 nanometers to about 15 nanometers, wherein forming at least two portions of titanium dioxide comprises forming at least a first portion comprising amorphous titanium dioxide and forming at least a second portion comprising crystalline titanium dioxide.

6. The method of claim 5, wherein forming at least two portions of titanium dioxide comprises depositing the at least two portions of titanium dioxide by atomic layer deposition.

7. The method of claim 6, wherein depositing the at least two portions of titanium dioxide by atomic layer deposition comprises depositing the at least a first portion comprising amorphous titanium dioxide by atomic layer deposition at a temperature of from about 150° C. to about 350° C.

8. The method of claim 6, wherein depositing the at least two portions of titanium dioxide by atomic layer deposition comprises depositing the at least a first portion comprising amorphous titanium dioxide by atomic layer deposition at a temperature of about 285° C.

9. The method of claim 6, wherein depositing the at least two portions of titanium dioxide by atomic layer deposition comprises depositing the at least a second portion comprising crystalline titanium dioxide by atomic layer deposition at a temperature of from about 350° C. to about 600° C.

10. The method of claim 6, wherein depositing the at least two portions of titanium dioxide by atomic layer deposition comprises depositing the at least a second portion comprising crystalline titanium dioxide by atomic layer deposition at a temperature of about 500° C.

11. The method of claim 5, further comprising crystallizing the at least a first portion of titanium dioxide.

12. The method of claim 11, wherein crystallizing the at least a first portion of titanium dioxide comprises transitioning the at least a first portion of amorphous titanium dioxide to rutile phase titanium dioxide.

13. A method of forming a high dielectric constant material, comprising:
   forming a material at a thickness of from about 1.2 nanometers to about 15 nanometers comprising:
      forming a first portion of amorphous titanium dioxide at a temperature of from about 150° C. to about 350° C.; and
      forming a second portion of crystalline titanium dioxide at a temperature of from about 350° C. to about 600° C.

14. The method of claim 13, wherein forming a first portion of amorphous titanium dioxide at a temperature of from about 150° C. to about 350° C. comprises depositing amorphous titanium dioxide.

15. The method of claim 14, wherein forming a second portion of crystalline titanium dioxide at a temperature of from about 350° C. to about 600° C. comprises transitioning the amorphous titanium dioxide to crystalline titanium dioxide.

16. The method of claim 13, wherein forming a first portion of amorphous titanium dioxide at a temperature of from about 150° C. to about 350° C. comprises depositing from about 0.2 nanometer to about 5 nanometers of titanium dioxide.

17. The method of claim 13, wherein forming a second portion of crystalline titanium dioxide at a temperature of from about 350° C. to about 600° C. comprises depositing from about 1 nanometer to about 10 nanometers of titanium dioxide.

18. A material having a high dielectric constant, comprising at least three portions of titanium dioxide, the at least three portions of titanium dioxide comprising at least a first portion comprising amorphous titanium dioxide, at least a second portion comprising crystalline titanium dioxide, and at least a third portion comprising amorphous titanium dioxide.

19. The material of claim 18, wherein the at least a second portion comprising crystalline titanium dioxide is between the at least a first portion comprising amorphous titanium dioxide and the at least a third portion comprising amorphous titanium dioxide.

* * * * *